US009112439B2

(12) United States Patent
Larsson et al.

(10) Patent No.: US 9,112,439 B2
(45) Date of Patent: Aug. 18, 2015

(54) METHOD AND CIRCUIT ARRANGEMENT FOR DETECTING MOTOR LOAD WITHOUT SENSORS AND FOR CONTROLLING MOTOR CURRENT ACCORDING TO LOAD FOR A STEPPER MOTOR (75) Inventors: Lars Larsson, Hamburg (DE); Bernhard Dwersteg, Hamburg (DE)

(73) Assignee: TRINAMIC MOTION CONTROL GMBH & CO. KG, Hamburg (DE)

( * ) Notice: Subject to any disclaimer, the term of this patent is extended or adjusted under 35 U.S.C. 154(b) by 151 days.

(21) Appl. No.: 13/883,355

(22) PCT Filed: Nov. 9, 2011

(86) PCT No.: PCT/DE2011/075263
§ 371 (c)(1),
(2), (4) Date: May 3, 2013

(87) PCT Pub. No.: WO2012/062310
PCT Pub. Date: May 18, 2012

(65) Prior Publication Data
US 2013/0221894 A1    Aug. 29, 2013

(30) Foreign Application Priority Data
Nov. 9, 2010 (DE) .......................... 10 2011 060 466
Feb. 8, 2011 (DE) .......................... 10 2011 000 569

(51) Int. Cl.
*H02P 8/00* (2006.01)
*G05B 19/40* (2006.01)
(Continued)

(52) U.S. Cl.
CPC *H02P 8/12* (2013.01); *G01R 19/00* (2013.01); *G05B 19/00* (2013.01); *H02P 6/182* (2013.01); *H02P 8/34* (2013.01); *G01R 31/343* (2013.01)

(58) Field of Classification Search
CPC ................ H02P 8/12; H02P 8/22; H02P 8/32
USPC .................................................. 318/685, 696
See application file for complete search history.

(56) References Cited

U.S. PATENT DOCUMENTS 4,012,679 A * 3/1977 Matsuda et al. .............. 318/713
4,492,903 A   1/1985 Knight et al.
(Continued)

FOREIGN PATENT DOCUMENTS

DE      3335420 A1    4/1985
DE     20305771 U1    8/2003
(Continued)

OTHER PUBLICATIONS

International Search Report (Mar. 20, 2013) for corresponding International Application PCT/DE2010/75263.
(Continued)

*Primary Examiner* — Eduardo Colon Santana
*Assistant Examiner* — Gabriel Agared
(74) *Attorney, Agent, or Firm* — WRB-IP LLP (57) ABSTRACT A method and a circuit arrangement are provided in which a mechanical load applied to the motor shaft or a load angle of the motor can be detected without sensors in a stepper motor. This is achieved substantially based on the fact that the load or the load angle creates a mutually induced voltage (back EMF) in the motor coils and the load or the load angle is detected by determining the phase shift of the motor voltage at at least one of the motor coil relative to the coil current at said motor coil connection, the phase shift being caused by the mutually induced voltage. A method and a circuit arrangement are also provided wherein the motor current of a stepper motor can be controlled according to load angle in such a way that the current consumption of the motor is relatively low.

18 Claims, 3 Drawing Sheets (51) Int. Cl.
*H02P 8/12* (2006.01)
*G01R 19/00* (2006.01)
*H02P 6/18* (2006.01)
*G05B 19/00* (2006.01)
*H02P 8/34* (2006.01)
*G01R 31/34* (2006.01)

(56) References Cited

U.S. PATENT DOCUMENTS

| | | | | |
|---|---|---|---|---|
| 5,486,743 | A * | 1/1996 | Nagai | 318/400.13 |
| 6,624,607 | B1 * | 9/2003 | Ellerthorpe et al. | 318/623 |
| 2006/0049791 | A1 * | 3/2006 | Larsson | 318/685 |
| 2006/0108967 | A1 * | 5/2006 | Tanaka et al. | 318/712 |

FOREIGN PATENT DOCUMENTS

| | | |
|---|---|---|
| DE | 102008001408 A1 | 10/2009 |
| EP | 0693816 A1 | 1/1996 |
| EP | 1345316 A1 | 9/2003 |
| EP | 1514342 B1 | 3/2005 |
| JP | 2002281788 A | 9/2002 |

OTHER PUBLICATIONS

Recherchebericht (Oct. 17, 2011) (including International-style classification on p. 3 of 4) for corresponding German Application 10 2011 000 569.2.

* cited by examiner

METHOD AND CIRCUIT ARRANGEMENT FOR DETECTING MOTOR LOAD WITHOUT SENSORS AND FOR CONTROLLING MOTOR CURRENT ACCORDING TO LOAD FOR A STEPPER MOTOR

BACKGROUND AND SUMMARY

The invention relates to a method and a circuit arrangement which enable in a stepper motor a load angle of the motor to be detected in a sensor-free manner, in order to determine for example the amount of a mechanical load applied to the motor shaft (motor load-value). The invention further relates to a method and a circuit arrangement which enable the motor current of a stepper motor to be controlled in accordance with a load angle or a load value such that the current consumption of the motor is as low as possible. The invention can be used both for 2-phase and for 3- or more phase stepper motors.

Stepper motors usually are controlled and energized independent of a current, actual motor load, i.e. a required torque, in such a way that they generate sufficient torque for the highest motor load which is expected when a certain application occurs. Consequently, only two types of load scenarios are distinguished for such applications, i.e. motor standstill and motor operation.

Since the torque and the holding torque of a stepper motor for the most part are proportional to the RMS (root mean square) value of the motor current, multiplied by the sine of the load angle, the motor, in most situations, is operated with a motor current that is much too high in relation to the current actual motor load, i.e. is operated at a torque reserve that is much too high. If, for example, the motor is operated with a mean torque reserve of 100%, i.e. with a motor current that is twice as high as required, the result, given that the power loss of the motor is proportional to the square of the motor current, is a static power loss that is increased by a factor of four. Since the mechanical power taken in stepper motors often is small compared to the static power loss, energy losses ranging from 100 to 300% are to be expected, which actually is unnecessary. While a reduction of these losses would be possible by using rotary sensors (position sensors, rotary pulse generators, rotary angle sensors) and by analyzing the rotational positions of the rotor, this concept is rejected for the plurality of cost-sensitive stepper motor applications in which the stepper motor is used as a purely forward propelled drive and in which such or other rotation sensors thus are not required.

It is desirable to look for a possibility to lower the current consumption of a stepper motor especially by supplying it, based on an amount of a current, actually applied mechanical motor load or a load angle, with just enough current that is needed to provide the required torque.

It is desirable to provide a method and a circuit arrangement which enable the amount of a current mechanical load (load value) that is actually applied to the motor shaft of a stepper motor or a load angle of said motor to be detected in a sensor-free manner, in order for example to control the motor in such a way that its current consumption is as low as possible.

It is also desirable to provide a method and a circuit arrangement which enable the operation of a stepper motor based on a current, actual mechanical load (load value) applied to the stepper motor or a load angle of said motor such that the current consumption of the motor is as low as possible.

A special advantage of these solutions is that they can be realized in a relative easy manner as a component of a known stepper motor control circuit without requiring any changes to the mechanical design of the motor or without requiring any additional mechanical components such as rotary sensors, for example.

BRIEF DESCRIPTION OF THE DRAWINGS

Further details, characteristics and advantages of the invention can be found in the following description of preferred, exemplary embodiments based on the drawing. The following is shown

DETAILED DESCRIPTION

In the following description reference is made partly to a 3-phase motor for clarifying purposes only. The related and all other explanations are however valid accordingly also for motors with another number, especially a higher number of phases or for 2-phase motors.

First, the basic sequences of the method according to the invention are described, said sequences not being limited to the described embodiments but are valid also for other embodiments of the invention.

According to the invention use is made of the fact that the load angle of a motor, i.e. the angle between the rotor of the motor and the main direction of the magnetic field that is generated by the motor coils, also increases with increasing (mechanical) motor load.

In this process the direction of the rotor is defined by the direction of its magnetization. If there is no mechanical load, the angle of the rotor corresponds to the main direction of the magnetic field that is generated by the coils—this corresponds to a load angle of 0°. If the direction of the magnetization of the rotor in a two pole motor is orthogonal to the main direction of the magnetic field that is generated by the coils, then this corresponds to a load angle of 90°. This means that in a two pole motor the load angle, when the motor is at a standstill, corresponds directly to the mechanical deflection from the neutral position caused by the torque on the motor shaft (without a load with a load angle of 0°). In higher pole motors the load angle is an integral multiple of this mechanical deflection by the neutral position. In higher or high pole-count motors which have an accordingly higher step-resolution the determination of the load angle therefore would require very high resolution rotary pulse generators and very precise current measurements.

The determination according to the invention of the amount of the mechanical motor load (also called load or load value) that is represented by the load angle and can be determined from this, is based on the voltage that is counter-induced in the motor coils by the rotation of the rotor (counter-electromotive force, CEMF), and especially on the amount of this CEMF. In fact, the CEMF interferes with the voltage applied at the motor coils und by this causes a shift, in accordance with the amount of the CEMF, of the phase of a voltage which is generated at a motor coil and by this of the voltage (motor voltage) actually applied to the related motor-coil terminal, and thereby influences the coil current, so that without any counter measures, the actual coil current would no longer correspond to the desired target- or set current.

Usually, the coil current is impressed into the motor coils by means of a known chopper and a known chopper-control (i.e. chopper-method), respectively, and a usually sine-shaped set or target coil current course (specified current) which is provided for each motor coil, and by means of a motor supply voltage, in such a way that in each motor coil the actual coil current and the specified current are at least substantially identical. The chopper is provided to switch for example one or more bridge circuits, which enable each one of the motor coils to be connected with the motor supply voltage, by accordingly adjusting the chopper-cycles, i.e. especially the duty factor of the chopper phases, in such a way that by connecting and disconnecting, respectively, or change of poles of the related coil with and from, respectively, the motor supply voltage each an actual current is impressed into the coil which corresponds as far as possible with respect to its current direction, current amount and current shape (in micro-step operation usually a sine shape) to the related specified current (target current) and especially is independent from and not influenced by the counter-electromotive force (CEMF) of the motor, in order to drive the rotor. The actual current courses are detected for example by means of a measuring resistor at a foot of the related bridge circuit (or in another way) and provided to the chopper in the form of a voltage across the measuring resistor for accordingly adjusting the chopper cycles on the basis of a comparison thereof with the specified current. Therefore, unless otherwise indicated, it is assumed in the following that the actual coil currents are at least substantially identical with the specified (target- or set-) coil currents ("specified currents").

Therefore, the adjustment of the chopper cycles, i.e. the adjustment of the duty factor of the chopper phases, which is required for impressing the (target-) coil currents, is basically dependent also from the CEMF and by this from the load angle of the motor, so that this adjustment and its variation can be used for a sensor free determination of the load angle and its variation, respectively.

Further, it has to be considered that from the voltage which is applied to the motor coil terminals by means of the chopper cycles and the motor supply voltage Vcc, a motor voltage is generated at the motor coil terminals which is temporally averaged for example over a chopper cycle and which due to the inductance of the coils substantially represents an effective voltage. Thus, in the following, reference is made also to an effective motor voltage which is preferably averaged over a chopper cycle.

As mentioned above, the motor load angle is determined according to the invention on the basis of the phase shift, which is generated by the counter-induced voltage (CEMF), of the effective motor voltage (at at least one of for example three motor coil terminals) in relation to the coil current at this motor coil terminal.

However, this phase shift and by this also the duty cycle of the chopper phases (i.e. the chopper cycles) for the individual coils is influenced usually not only by the CEMF, but also by other influences as for example static motor properties, especially the internal resistance and the inductance of the motor coils and the supply voltage and possibly also by other dynamically occurring effects.

For the preferred removal of these influences, several measures are proposed according to the invention. However, at first some principles and terms shall be explained and defined, which are important in connection with these measures.

Chopper methods are generally known, wherein three different chopper phases are distinguished namely ON-, FD- and, if any, SD-phases, the duty cycles of which (i.e. their temporal durations) are timed in relation to each other such that the actual current through the motor coils follows a target current (specified current), e.g. a sin- or cosine-shape, given for the related motor coil, as closely as possible, and is not at all, or only to an extent which is not relevant for the related application, changed by the CEMF and the said other influences and effects.

During the ON-phase (also called positive switch-on phase), the coil current is actively driven into a coil in the direction of the currently specified polarity and the direction of the coil current so that the coil current amount increases relatively quickly and continuously (switch-on period). This means that the coil current direction that is impressed by way of an ON-phase corresponds to the instantaneous polarity and, respectively, to the direction of the coil current.

In case of a sine-shaped coil current the polarity of the coil current is positive in the first and second quadrants and negative in the third and fourth quadrants, for example.

In the FD-phase (also called negative switch-on phase), the coil current is actively reduced again against the just specified polarity of the coil current by reversing the polarity of the coil and feeding the coil current back into the current supply. The FD-phase is used to reduce the coil current relatively quickly, especially in the phases of decreasing coil current amount (i.e. during the second and fourth quadrant of a sine-shaped coil current).

The third chopper phase is the recirculation phase or SD-phase, in which the related coil is not controlled actively but rather is short circuited or bridged so that the coil current only decreases gradually (i.e. slower than during the FD-phase) due to the internal resistance of the coil and the CEMF.

Thus, these three chopper phases are temporally activated, dimensioned and combined by the chopper by means of chopper switch signals (usually PWM signals) which are applied to the output of the chopper and supplied to a driver circuit such that the actual coil current follows a specified current (target coil current) as contemporaneously and exactly as possible across its entire (e.g. sine-shaped) course, i.e. during the increasing and decreasing coil current phases, and in particular is not changed (much) by the counter induced voltage (CEMF) caused by the rotor in the motor coils.

A chopper cycle is to be understood in this connection as a sequence of one ON-phase, one FD- (Fast Decay) phase and, if any, one SD- (Slow Decay) phase.

Figure 1A:
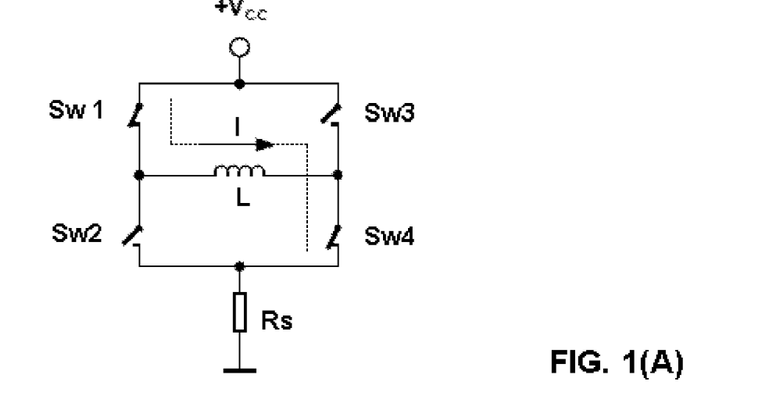
FIGS. 1A-1C show circuit diagrams with different coil current phases in a motor coil during chopper operation.
Figure 1B:
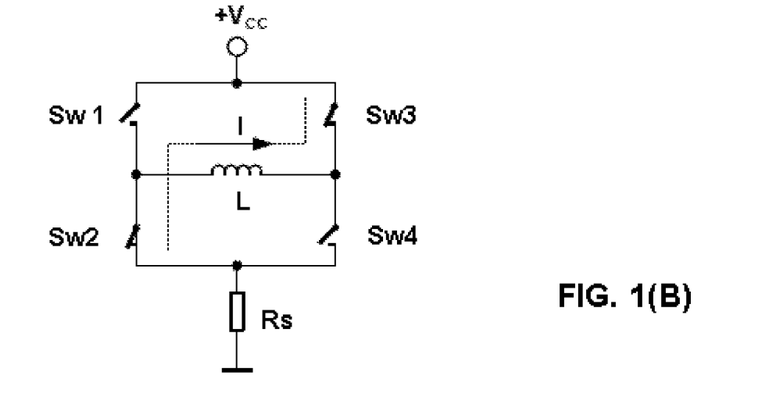
Figure 1C:
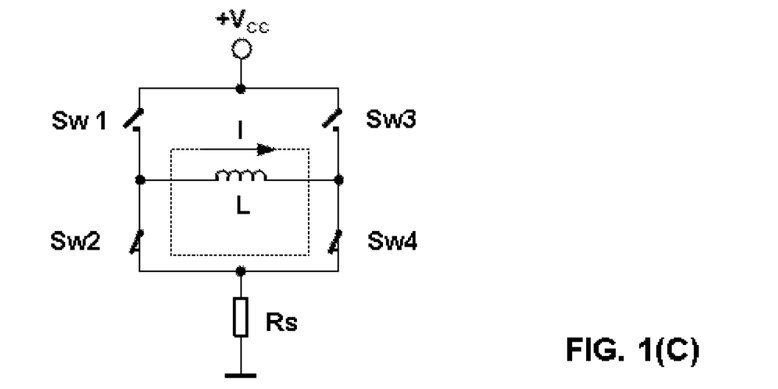

These three chopper phases are indicated schematically in FIG. 1(A), FIG. 1(B) and, respectively, FIG. 1(C). These three figures each show a bridge circuit of a first through fourth switch Sw1, Sw2, Sw3, Sw4, wherein a first and a second switch Sw1, Sw2 as well as a third and fourth switch Sw3, Sw4 are each connected in series and the two series connections are connected in parallel. The related motor coil L is connected to the centers of the bridge branches. The foot of the bridge circuit typically is connected to ground via a measuring resistor $R_S$ for detecting the actual motor currents which are impressed into the motor coils, while the head of the bridge circuit is connected to a supply voltage Vcc of the motor. The switches Sw1, Sw2, Sw3, Sw4 are switched by means of a driver circuit which is supplied with chopper switch signals for activating the chopper phases.

FIG. 1(A) shows the switch positions and the resulting direction of the current flow 1 through the coil L in the direction of the specification during the above mentioned first or ON-phase, in which this direction is the same one as the specified direction or polarity of the coil current, wherein the first and the fourth switches Sw1, Sw4 are closed and the second and third switches Sw2, Sw3 are open.

FIG. 1(B) shows the switch positions and the resulting reversal of the polarity of the coil L as well as the return feed of the coil current I into the voltage supply Vcc, i.e. against the specified direction or polarity of the coil current (which is the same one here as in FIG. 1(A)) during the above mentioned second or FD-phase in which the first and the fourth switch Sw1, Sw4 are open and the second and third switch Sw2, Sw3 are closed.

Finally FIG. 1(C) shows the third or SD-phase in which the coil L is short circuited or bridged, i.e. the second and the fourth switch Sw2, Sw4 are closed while the first and the third switch Sw1, Sw3 are open (or correspondingly reverse) so that the current I that flows in the coil L gradually decreases, i.e. recirculates, in accordance with the internal resistance of the coil L.

For reasons of convenience, a sine-shaped current control of the coils is assumed for the following considerations, i.e. in a 3-phase stepper motor one of the coils is energized with a sine-shaped current course and the other two coils are energized each with a sine-shaped current course which is shifted in relation thereto by 120° and 240°, respectively. However, the following considerations apply accordingly for non-sine-shaped control and/or stepper motors with another number of phases and the resulting other phase shifts of the controlling coil currents in relation to each other.

As mentioned above, the said phase shift is influenced not only by the CEMF generated by the motor load, but also by further parameters and effects which are especially dependent on the related motor like for example the supply voltage, the inductance and the internal resistance of the motor, etc. For avoiding the resulting inaccuracy of the measurement of the load angle, the above mentioned phase shift and by this the load angle is preferably measured at a characteristic point in time which enables to achieve an at least substantially stable measuring result which is substantially independent of the undesired parameters and effects.

It has revealed that such characteristic points in time are especially those points in time, at which the courses of the effective motor voltages at two motor coil terminals intersect each other, i.e. have the same instantaneous value. At these intersecting points the above mentioned undesired effects which are finally caused especially by the absolute level and the shape of the motor voltage, essentially compensate each other due to the symmetry of the motor.

Therefore, the phase shift (and by this also the load angle) is measured preferably at an intersecting point of the courses of two of the three effective motor voltages (in case of a 3-phase motor) at two of the three motor coil terminals, namely between one of these two intersecting motor voltages and the coil current at this same motor terminal.

For an as high as possible accuracy of the measurement of the load angle, the temporal precise and as low as possible noisy determination of such an intersecting point of the motor voltages (which are as mentioned above averaged over each one chopper cycle and are effective voltages) is of particular advantage. For this purpose, preferably the following method is provided:

In order to temporally determine the intersecting points of each two effective motor voltages (i.e. motor coil voltages), at first the temporal durations of the positive active switch-on phases of the chopper-cycles, i.e. the temporal durations of the ON-phases (or, as an alternative, the negative active switch-on phases, i.e. FD-phases, for which the following explanations are applicable accordingly) are measured preferably at each motor terminal (i.e. motor coil terminal). These measured switch-on temporal durations are then slidingly averaged preferably by means of each an accumulator (especially an accumulator register) separately for each of the for example three motor terminals as explained in the following for two exemplary embodiments.

According to a first preferred embodiment, the temporal durations of the ON-phases (or of the FD-phases), which occur once in each chopper cycle, are successively (i.e. during chopper cycles which follow one after another) accumulated. In this process, for example after each addition of each one temporal duration of an ON-phase (or an FD-phase, respectively), a certain fraction of the content of the accumulator is subtracted. This addition and subtraction is preferably repeated separately for each of the, for example, three motor terminals, and preferably during each chopper cycle and consequently for all chopper cycles, i.e. for each measured temporal duration of an ON-phase (or FD-phase, respectively), so that for each of the (two or three or more) motor coil terminals each one sliding average value of the switch-on temporal durations is obtained.

With this method, sliding average values are obtained in the sense, that they are proportional to the fraction of the accumulator content which is to be subtracted after each addition. If for example after each addition (i.e. in each chopper cycle) 1% of the temporal durations of the ON-phases which have been accumulated up to now are again subtracted, the sliding average value corresponds to the arithmetic average value which is multiplied by the factor 100. If for example 100 times a value of 3 is added and after each addition 1% of the up to now accumulated value is again subtracted, then the sliding average value asymptotically approaches the value 300.

According to a second embodiment, it is also possible to add the active switch-on temporal durations (ON- or FD-phases) and then divide the sum by the number of the added temporal durations, in order to obtain a scaling in the form of a sliding arithmetic average value.

The subtraction of the said fraction of the accumulator content according to the first embodiment finally results in sliding average values of the switch-on temporal durations in the sense of a temporal filtering, the filter time constant of which can be adjusted each by the amount of the fraction to be subtracted in each chopper cycle, and can be adapted for example to the frequency of the related controlling sine wave of the motor target current for the related motor terminal and by this to the rotating velocity of the motor in such a way that a desired or optimum signal to noise ratio of the sliding average values of the switch-on temporal durations for the motor coil terminals is obtained and by this a temporal precise determination of the above mentioned intersecting point is enabled with low noise.

Basically, the temporal filtering and the temporal duration of the sliding average generation, respectively, should have a bandwidth, which preferably is on the one hand clearly above the actual frequency of the target coil current, and on the other hand enables the suppression of potential disturbances which are caused for example by deficiencies in the current regulation, so that the influence of a single chopper cycle is as low as possible. This means, that the temporal duration of the sliding average generation is preferably adjusted such that the averaging is conducted over a fraction (from some percent up to some 10%) of the number of chopper cycles of each electric period of the target coil current.

On the basis of the controlling sequence of a for example 3-phase motor with three phase shifted sine-waves of the target or set coil currents as explained above, which controlling sequence is determined by the direction of rotation, it is known in which order the intersecting points, i.e. the equality of each two of the three effective motor voltages at the motor terminals occur. On this basis, now those two sliding average values of the switch-on temporal durations at those motor terminals are compared with each other, for which in accordance with the direction of rotation of the motor the next intersecting point in the controlling sequence of the target coil currents is to be expected. As soon as these two sliding average values of the switch-on temporal durations are equal and, by this, an intersecting point of the effective motor voltages, which are preferably averaged over each one chopper cycle, is detected, each one fixed point in time of these two motor voltages is set.

In other words, at the sought intersecting points of the said each two effective motor voltages, also the sliding average values of the ON-phase- or switch-on temporal durations, by means of which these motor voltages are generated, are at least substantially equal.

In principle, at the point in time of the occurrence of the intersecting point between two effective motor voltage at two motor terminals (i.e. motor coil terminals) which is determined as explained above, the phase shift between one of these two (equal) motor voltages at one of the two motor terminals and the coil current at this motor terminal can be detected and from this the load angle of the motor can be determined for the following reasons:

On the one hand, the phase of the effective motor voltage (which due to the counter-EMF is shifted in relation to the coil current) at the intersecting point is known, because such an intersecting point occurs at defined phase angles. For example, a $\sin(x)$ voltage and a $\sin(x+120°)$ voltage intersect each other at two defined points in each electric period, i.e. each intersecting point of two coil voltages belongs to a fixed angle within the course of the voltage. By this, the phase position of the motor voltage known.

On the other hand, also the phase position of the coil current is known, because this current is impressed on the basis of the preset target or set coil currents into the motor coil terminals. By this, the phase position of the motor voltage at a motor terminal can now be compared with the phase position of the coil current at this same motor terminal, and from the difference between both the load angle can be determined.

However, preferably the following side effect is taken into account additionally:

The above explained temporal filtering of the temporal durations of the ON-phases of the chopper-control generates as a side effect a temporal shift of the sliding average values and by this also of the said intersecting point, i.e. both the effective motor voltage, which is averaged over the chopper-cycle, and which is rising before the intersecting point, and the effective motor voltage which is falling before the intersecting point, is delayed due to the filter time constant in relation to the effective motor voltages which are actually applied to the motor terminals. By this, also the intersecting point is delayed by this same amount. Consequently, an angle error occurs in relation to the actual rotation angle of the rotor at the point in time of the detection of the intersecting point (and by this of the load angle), which error is dependent on the selected filter time constant and the number of revolutions of the motor, respectively. This angle error should be corrected as exact as possible, or it should be taken into account when determining the load angle. A reasonable consideration of this angle error could be realized by filtering in the same way the load angle signal to be read out when an intersecting point is reached. However, because the course of the load angle itself is not necessarily sine-shaped, it is not easily possible to appropriately filter it.

However, the predetermined target or set coil currents are sine-shaped, so that they can be used as an angle reference when correcting the angle error. In case of a motor without a load (load angle 0°), the intersecting point of two motor voltages correlates with the related intersecting point of the two motor coil currents at the respective motor terminals. In case of a 3-phase motor, at the intersecting point of two motor coil currents, the third motor coil current has a minimum. Due to the fact that the variation of the latter is a minimum at this point of time, it makes not much sense to use it for the measurement. However, the motor coil current having a decreasing amount is appropriate as a reference, because in case of a 3-phase motor it is remote from the minimum by 120°, i.e. it principally enables the desired detection of a load angle within the nominal load angle range from between 0 to 90°. Considering the flattening of the gradient with increasing approach to the minimum and maximum, respectively, of the sine-wave, and, by this, the reduced sensitivity of the referencing, a load angle from up to −30° and up to +120°, respectively, can be detected. This applies correspondingly also for a 2-phase motor.

Thus, the load angle is preferably determined in such a way, that at an intersecting point (or equality) between the effective motor voltage at a motor terminal X (rising voltage) which is averaged over a chopper cycle and temporally filtered due to the above explained sliding average value generation, and the effective motor voltage at a motor terminal Y (falling voltage), the target or set coil current for the motor terminal Y which is finally identically filtered (which in its non-filtered form due to the chopper method corresponds with the actual coil current at this motor terminal) is read out at the characteristic point in time, i.e. the intersecting point of both motor voltages (which was determined on the basis of the equality of the sliding average values of the active switch-on temporal durations at two motor terminals).

The filtering and temporal delay, respectively, of the related target coil currents is conducted by means of known filter units in such a way that by this they are exposed to the same phase shift and temporal delay, respectively, as the intersecting points of the motor voltages which intersecting points are determined by the above explained temporal filtering of the switch-on temporal durations.

It was found that stepper motors do not produce even CEMF in some cases due to the anisotropy of the magnetic poles or their position in relation to one another in the range of an electric period, but rather that the CEMF can fluctuate in the range of several percentage points within an electric period. This fluctuation then also is reflected in the load angles that are determined at different intersecting points of the motor voltages. This is why preferably an arithmetic averaging of a plurality of load angles is conducted which are determined at different intersecting points of the motor voltages, making it possible to significantly improve the above described determination of the motor load or load angle.

After determining the load angle or the averaged load angle as explained above, it can be used for example for determining a motor load value, for measuring a torque, for recognizing a stop, against the motor has run, for detecting mechanical malfunctions of the motor or for other purposes.

However, an especially preferred application of the determined load angle (or the average load angle) is the regulation of the amount of the actual motor coil currents in dependence of the load angle and by this of the load value, and especially in such a way that the motor always consumes only such an amount of current as it just needs for generating the desired torque. For this purpose, the actual motor coil currents are preferably controlled such that the load angle is always as high as possible and especially such high that just no step losses occur at the motor. The actual motor coil currents are especially controlled such that the load angle remains within a defined range, i.e. on the one hand is sufficiently high for generating the motor torque, which is needed for rotating the (mechanical) motor load which is currently applied at the motor axis, but on the other hand is not considerably higher. In this way, the power loss of the motor can be reduced significantly in comparison to the known operation of the motor with always a maximum of current, without increasing the risk of step losses.

To control the actual coil current for each motor coil, preferably a controller is used that comprises a first comparator for an upper control threshold H that is set at a high load angle, as well as a second comparator for a lower control threshold R that is set at a low load angle, wherein between both control thresholds the desired range of the load angles extends.

In this process, when the load angle exceeds the upper control threshold H, the actual motor current I (i.e. all motor coil currents) preferably is regulated up quickly, i.e. is increased to a preset maximum current value Imax within one or just a few measuring cycles of the load value, until the load angle L falls below the upper control threshold H again during a subsequent measuring of the load angle and thus decreases accordingly. This allows the motor to react quickly to a load increase in order to further reduce the risk of step losses due to exceeding a maximum load angle of e.g. 90°.

To ensure that the controller does not become unstable, the actual motor current I preferably is not regulated down as quickly when the load angle L falls below the lower control threshold R, but rather is regulated down in smaller steps, i.e. slower than compared to the quick up-regulation of the current.

Figure 2:
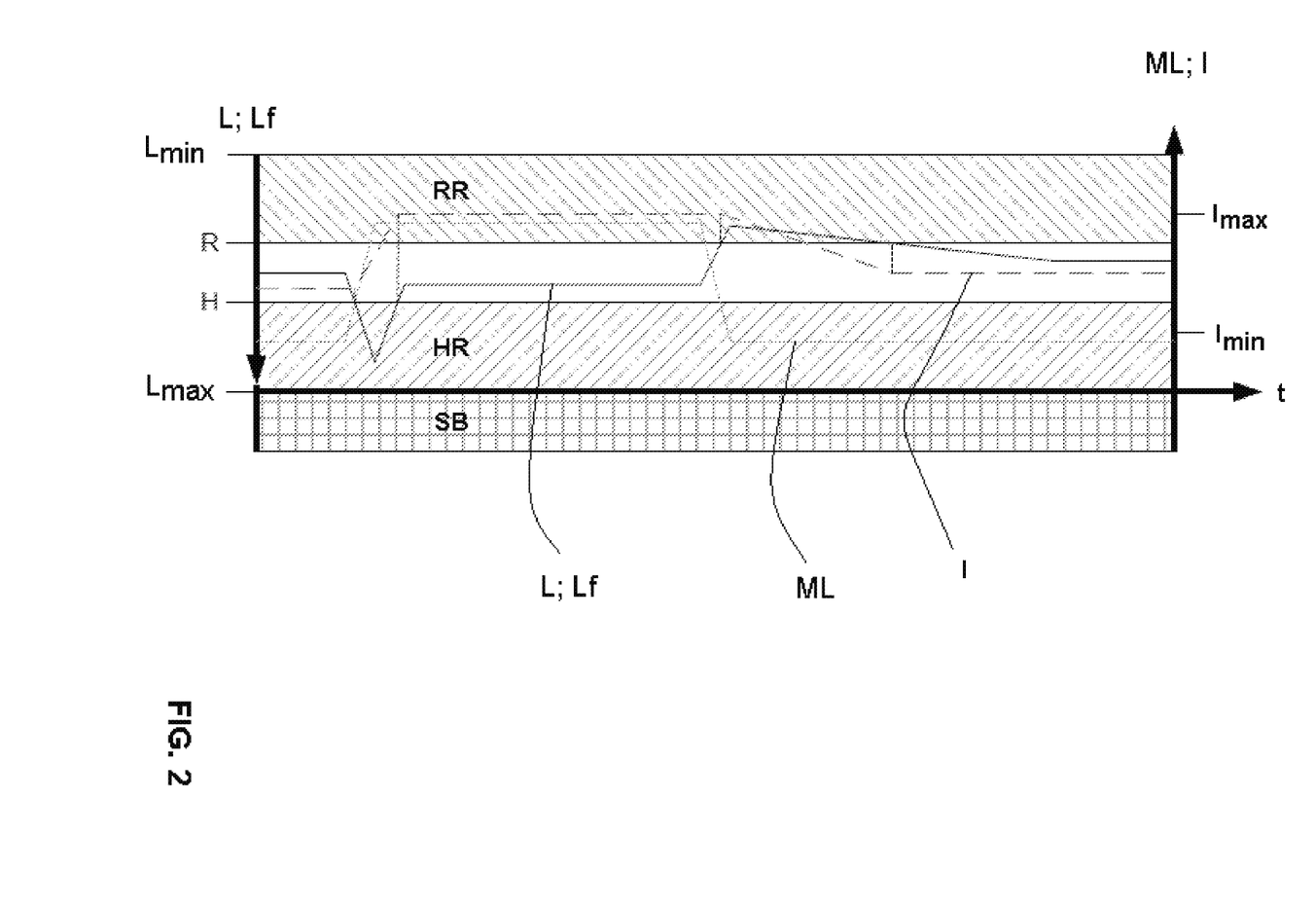
FIG. 2 shows a diagram of the temporal relationships and courses of a load that is applied to a motor, the resulting load angle as well as a motor current controlled by this.

These temporal courses of the load angle and of the amount of the motor current I as well as their interrelationships for this control process are shown in detail in the diagram of FIG. 2, which also includes an assumed course of a motor load ML.

On the horizontal axis the time t and on the left vertical axis the load angle L is entered each increasing in the direction of the arrow, wherein a minimum load angle Lmin of e.g. 0° and a maximum load angle Lmax of e.g. 90° is indicated. On the right vertical axis the actual motor coil current I for one of the motor coils and a motor load ML is entered each increasing in the direction of the arrow.

Further, on the left vertical axis the upper control threshold H as well as the lower control threshold R for the load angle L are entered. With a load angle Lmax, the maximum motor load relative to the currently adjusted motor current I is applied. A minimum motor current Imin and a maximum motor current Imax are indicated on the right vertical axis.

In addition, three control areas are marked in this diagram in shade: a first area (up-regulate area) HR in which the motor current I is to be increased, and a second area (down-regulate area) RR in which the motor current I is to be reduced. Finally a stall area SB of the motor is indicated as well, which is reached when the maximum motor load ML in relation to the currently adjusted motor current is exceeded and thus the maximum load angle Lmax is exceeded, and in which step losses can occur.

The curve ML indicates an assumed temporal course of a mechanical motor load applied to the motor shaft. The curve 1 indicates the temporal course of the amount of the motor current, while the curve L shows an assumed temporal course of the load angle (and the curve Lf shows an assumed temporal course of an averaged load angle, respectively) that is determined, as explained above, by the current motor load ML and the currently adjusted motor current I.

So if according to FIG. 2 the motor load ML increases, the load angle L also increases with initially unchanged motor current I. If in the process the load angle L exceeds the upper control threshold H upwards (and thus a preset high load angle is exceeded), the actual motor current I is increased relatively quickly as explained above, until the load angle L falls below the upper control threshold H again and thus returns into the desired range. With an unchanged increased motor load ML the motor current I then remains constant at a high or maximum value Imax until the motor load ML decreases again. If in the process the load angle L falls below the lower control threshold R while the high motor current Imax remains unchanged, the motor current I is regulated down (slowly, as explained above) until the load angle L exceeds the lower control threshold R upwards again and thus returns into the desired range. Then, the motor current I remains substantially constant, and with unchanged motor load ML the load angle L (and the averaged load angle Lf, respectively) stays again in the desired range between the lower and the upper control threshold R, H.

Figure 3:
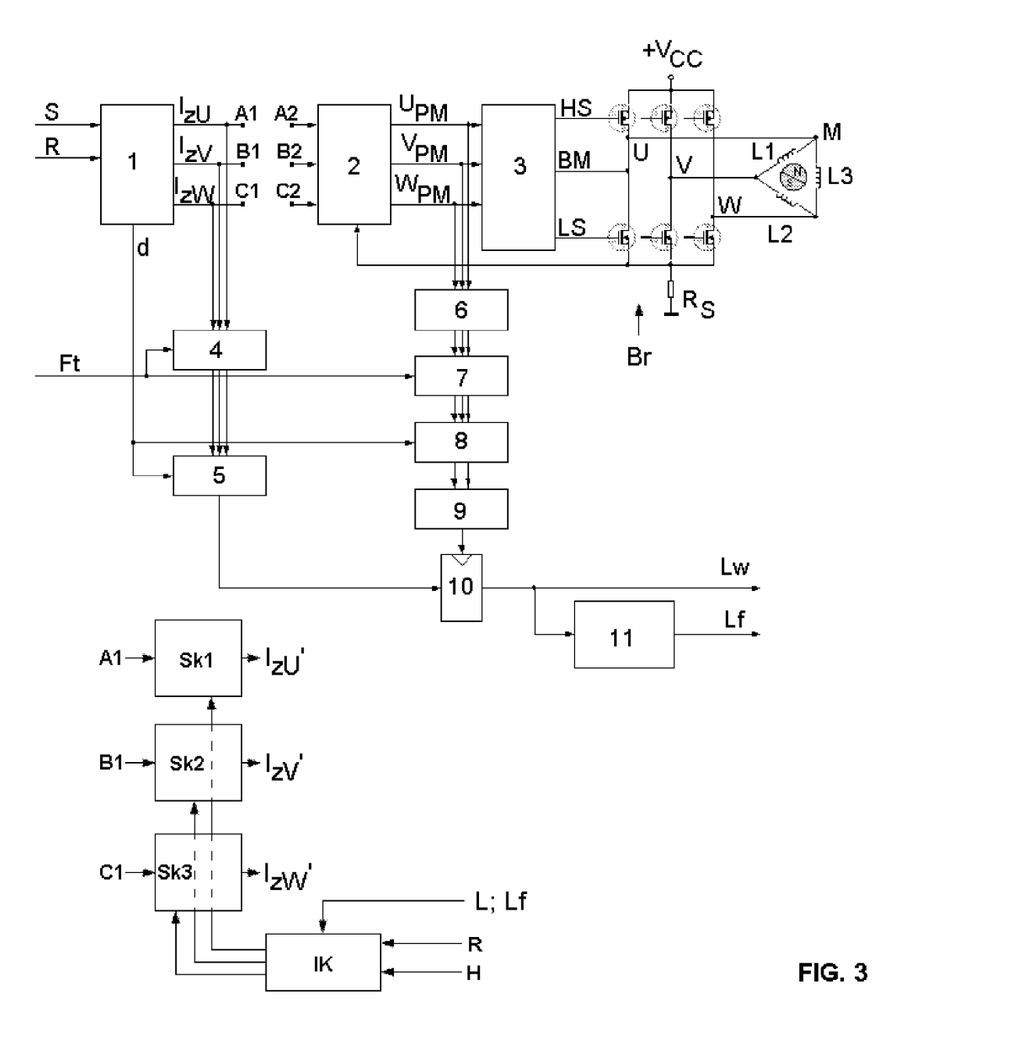
FIG. 3 shows a principle circuit diagram of a stepper motor control unit that includes the components for carrying out the method according to the invention.

FIG. 3 shows an example of a schematic block wiring diagram of a circuit arrangement for carrying out the method in accordance with the invention, as part of a circuit arrangement for controlling a 3-phase stepper motor M comprising three coil L1, L2, L3 which are connected in a known manner in a star or delta connection or in another way and are connected to three motor coil terminals U, V, W. The motor coil terminals U, V, W are supplied with current from a motor supply voltage source Vcc in a known manner by means of each one power drive half bridge circuit Br. A known 3-phase motor driver unit 3 is used to control the three power driver bridge circuits Br. Since different types of these circuit components are generally known, they do not need to be explained further at this point.

The motor driver unit 3 is connected to the outputs of a chopper 2 known per se (also called chopper unit or chopper circuit) which is provided for generating chopper switch signals $U_{PM}$, $V_{PM}$, $W_{PM}$ (usually PWM signals), by means of which during the ON-phases coil currents are actively driven through the coils L1, L2, L3 by the motor supply voltage Vcc by means of the motor driver unit 3 and the power driver bridge circuits Br, and by means of which during the FD-phases the poles of the coils L1, L2, L3 are reversed for actively reducing the coil currents, and by means of which during the SD-phases the coils L1, L2, L3 are short circuited, all in accordance with the above explanations in connection with FIG. 1. Since the chopper 2 and the generation of the chopper switch signals $U_{PM}$, $V_{PM}$, $W_{PM}$ is also known per se, they do not need to be described in more detail.

As mentioned above, the motor coil current, which is actually flowing into or out of the motor coil terminal U, V, W being each connected with the supply voltage Vcc and which is flowing through the related motor coil, is detected preferably by means of a measuring resistor Rs (and the related voltage drop at this resistor) at the foot point of the bridge circuit Br and is routed to the chopper 2.

The circuit arrangement further comprises according to FIG. 3 a target current sequencer 1 known per se, by means of which the target or set current values IzU, IzV, IzW which are to be impressed into each motor coil terminal U, V, W are generated in dependence on supplied input signals S, R indicating a desired direction of rotation and a desired rotating speed and number of steps of the motor, respectively. These current values usually have a sine shape or cosine shape, their amplitudes, frequencies and phases in relation to each other being generated in a known manner such that the motor M rotates in a desired direction with a desired speed in accordance with the input signals S, R.

The circuit arrangement further comprises a time measuring unit 6, which receives the chopper switch signals $U_{PM}$, $V_{PM}$, $W_{PM}$ and by means of which the switch-on temporal durations of the positive (or negative) active switch-on phases of the chopper-control, i.e. the temporal durations of the ON-phases (or of the FD-phases), are measured for each of the three motor terminals U, V, W.

These measured temporal durations are then supplied to a first filter unit 7, by means of which these measured switch-on temporal durations are accumulated separately for each of the three motor terminals U, V, W and are averaged as explained above, in order to calculate the said three sliding average values of the switch-on temporal durations. Preferably, the filter time constant Ft of the filter unit 7 is adjustable by means of a related signal Ft which is supplied.

These three sliding average values are then supplied to a first phase selector 8 for selecting by means of an angle signal d (sextant signal), supplied from the target coil sequencer 1, those two sliding average values, for which in accordance with the direction of rotation of the motor the next intersecting point in the controlling sequence of the motor target currents is to be expected.

These two sliding average values are then supplied to an intersecting point detector 9 for detecting the intersecting point of both and for determining in this way the above mentioned fixed point in time of the two motor voltages. As soon as this point in time occurs, the intersecting point detector 9 generates a switch signal which is supplied to a control input of a latch 10 in order to trigger the same.

However, because this intersecting point is delayed due to the temporal filtering of the switch-on temporal durations according to the above explanations and thus the load angle determined from this would comprise an angle error, preferably one of the two target coil currents, for which the intersecting point of the two motor voltages generated therefore has been determined, especially the target coil current having a decreasing amount as explained above, is used for generating a reference and for correcting this angle error.

For this purpose a second filter unit 4 is provided which is preferably adjustable and to which the target or set coil currents IzU, IzV, IzW for the three motor terminals U, V, W are supplied which are generated by the target current sequencer 1 and are applied to its outputs. This second filter unit 4 is provided such that it comprises a filter time constant with which the target coil currents IzU, IzV, IzW are each exposed to the same temporal delay and temporal filtering, respectively, as the sliding average values of the switch-on temporal durations by the first filter unit 7. For this purpose, the first and the second filter unit 7, 4 are preferably adjustable by means of a filter time constant Ft which is supplied to both filter units 7, 4 and which is, as explained above, selected or generated for example in dependence on the rotation velocity of the motor such that an as high as possible signal to noise ratio is obtained.

The target coil currents IzU, IzV, IzW which are temporally filtered in this manner are then supplied to a second phase selector 5 for selecting as a reference current by means of the angle signal d supplied from the target current sequencer 1 the above mentioned target coil current having a decreasing amount.

The selected reference current is routed from the output of the second phase selector 5 to a data input of the latch 10. As soon as the latch 10 is triggered by the intersecting point detector 9, the reference current signal is routed to a load value output Lw of the circuit arrangement. Then, the load value and the load angle L, respectively, can be calculated directly from this in a known member by means of the arc-sine-function.

However, as mentioned above, preferably an averaging of several load angles L, especially an arithmetic averaging, is conducted. Such an averaging is conducted for example by means of a third filter unit 11 and over a control period of the motor, so that the said filtered and averaged load value and load angle Lf, respectively, is available at the output of the third filter unit 11.

The determined load angle L and the averaged load angle Lf, respectively, is now fed to each one output of the circuit arrangement, in order to indicate for example a related measuring value for a user which indicates the load angle or a mechanical load applied to the motor, or to provide the load angle for other measurements or analyses. The motor load which has been detected in this manner without a sensor can thus be used for other purposes, independent of controlling the motor current in dependence on the load angle.

For adjusting the amount of the actual coil currents according to the invention in dependence on the load angle L or the averaged load angle Lf which has been determined according to the invention without a sensor, a current regulator Ik and a first, a second and a third scaling unit Sk1, Sk2, Sk3 is provided, the latter being controlled by the current regulator Ik and being connected between the output of the target current sequencer 1 and the input of the chopper 2 for scaling the target or set current values generated by the target current sequencer 1.

The current regulator Ik comprises a first input for a load angle L or preferably an averaged load angle Lf of the motor M determined as explained above, a second input for a lower control threshold R and a third input for an upper control threshold H, which both are preferably predetermined or adjusted by a user or in any other way.

The current regulator Ik comprises a first comparator for comparing the load angle L or the averaged load angle Lf, supplied via the first input, with the lower control threshold R supplied via the second input, and a second comparator for comparing the load angle L or the averaged load angle Lf, supplied via the first input, with the upper control threshold H supplied via the third input. The current regulator Ik further comprises a circuit unit for generating for each of the three motor coil terminals U, V, W a common scaling value on the basis of the output signals of both comparators according to the above explanations in connection with FIG. 2, which scaling value is supplied each in the form of a control signal to the first scaling unit Sk1, the second scaling unit Sk2 and the third scaling unit Sk3.

The scaling units Sk1, Sk2, Sk3 further comprise each an input A1, B1 and C1, respectively, to which the target or set coil current value IzU, IzV and IzW, respectively, is applied which is generated each by the target current sequencer 1. These target or set coil current values are then scaled by means of the scaling units Sk1, Sk2, Sk3 according to the scaling values, so that a scaled coil current value IzU' which is actually to be impressed into the first motor coil terminal U, a scaled coil current value IzV' which is actually to be impressed into the second motor coil terminal V, and a scaled coil current value IzW' which is actually to be impressed into the third motor coil terminal W, respectively, is applied to the output of the scaling units, which are each supplied to the related input A2, B2 and C2, respectively, of the chopper 2 for generating the chopper switch signals $U_{PM}$, $V_{PM}$, $W_{PM}$.

Consequently, each supplied predetermined target coil current value IzU, IzV, IzW is increased and decreased, respectively, in dependence on the determined load angle L (and the averaged load angle Lf, respectively) according to the above explanations especially in connection with FIG. 2, by means of the scaling units Sk1, Sk2, Sk3.

The invention claimed is:

1. Method for sensor-free detection of a motor load angle or load value in a stepper motor, comprising:
   generating from supplied target coil currents by a chopper process chopper switch signals,
   impressing, by a motor supply voltage which is switched by the chopper switch signals the target coil currents into motor coil terminals,
   generating, via the load angle and the load value, respectively, a counter-induced voltage in the motor coils,
   determining a temporal intersecting point of the courses of two motor voltages at two motor coil terminals,
   detecting a phase shift, caused by the counter-induced voltage, between one of these two motor voltages and the coil current at this motor coil terminal at the moment of the occurrence of the intersecting point,
   and determining the load angle and the load value, respectively, on the basis of the phase shift.

2. Method according to claim 1, comprising determining for each motor coil terminal sliding average values of the active switch-on temporal durations of the chopper cycles, and wherein the temporal intersecting point is defined, when two sliding average values are at least substantially equal.

3. Method according to claim 2, comprising measuring, for determining the sliding average values the temporal durations of the positive or negative active switch-on phases of the chopper cycles, at at least two of the motor coil terminals, and averaging the measured switch-on temporal durations for each of the motor terminals separately by an accumulator.

4. Method according to claim 3, in which averaging is conducted by addition and following division by the number of the added-up switch-on temporal durations, in order to obtain a sealing in the form of each an arithmetic average value.

5. Method according to claim 3, comprising conducting averaging by addition each one switch-on temporal duration to the content of the accumulator and following subtraction of a fraction of the content of the accumulator.

6. Method according to claim 5, wherein the subtraction of the fraction represents a time-based filtering of the switch-on temporal durations with a time-constant of the filter, which time-constant can be adjusted by the height of the fraction and which is adapted to the rotating speed of the motor in such a way that a desired or a maximum signal to noise ratio of the sliding average values results.

7. Method according to claim 2, wherein, for correcting or compensating a delay in time of the intersecting point, which delay is caused by the generation of the sliding average values, and of an accompanying fault in the phase shift, one of the supplied target coil currents is equally delayed in time and used as an angle reference.

8. Method according to claim 7, comprising, for determining the phase shift at the moment of the detection of the intersecting point, reading out the target coil current for the one of the motor coil terminals, at which the decreasing one of the two motor voltages which are intersecting each other occurs.

9. Method according to claim 1, comprising calculating an averaged load angle by arithmetically averaging several load angles which are each determined at different intersecting points of the motor voltages.

10. Method for adjusting a motor current in a stepper motor, in which a load angle or a load value of the motor is determined by a method according to claim 1, and in which the motor current is controlled in dependence thereon such that the load angle amounts about 90°, or such that just no step losses occur at the motor.

11. Method according to claim 10, in which the motor current is increased in case of an increasing motor load faster than it is decreased in case of a decreasing motor load.

12. Method according to claim 10, in which an upper regulation threshold is defined at which the motor current is increased, when the load angle exceeds the upper regulation threshold in a direction upwards, and in which a lower regulation threshold is defined, at which the motor current is decreased, when the load angle exceeds the lower regulation threshold in a direction downwards.

13. Circuit arrangement for sensor-free detection of a motor load angle or load value in a stepper motor, by a chopper, comprising:
   a time measurement device for measuring the switch-on temporal durations of the active switch-on phases, i.e. of the ON- or FD-phases, of the chopper control for each of the motor terminals,
   a first filter unit for generating sliding average values of the measured switch-on temporal durations,
   a first phase selector for selecting those two sliding average values, for which according to the direction of rotation of the motor it next intersecting point is to he expected, and
   an intersecting point detector for detecting the moment of the occurrence of an intersecting point, at which the load angle or load value is determined.

14. Circuit arrangement according to claim 13, comprising a second filter unit for exposing supplied, target coil currents to the same delay in time or filtering in time as the sliding average values of the switch-on temporal durations are delayed by the first filter unit, wherein the load angle or load value is determined on the basis of the temporally delayed target coil current which is read out at the moment of the detection of the intersecting point.

15. Circuit arrangement according to claim 14, comprising a second phase selector for reading out the delayed target coil current for the one of the motor coil terminals, at which the decreasing one of the two motor voltages which are intersecting each other occurs.

16. Circuit arrangement according to claim 14, comprising a latch which is triggered by the intersecting point detector, in order to read out the temporally delayed target coil current and then determine from this the load angle or the load value.

17. Circuit arrangement for adjusting a motor current in a stepper motor, comprising a circuit arrangement according to claim 13, comprising
   a chopper for generating chopper switch signals for impressing target coil currents into motor coil terminals by a motor supply voltage,
   scaling units superposed to the chopper, for scaling supplied predetermined target coil currents, and
   a current regulator for generating scaling values for the scaling units from a supplied value of a load angle or a load value in such a manner that scaled target coil currents are impressed into the motor coil terminals for operating the motor with a load angle in a range of about 90° or in such a way that just no step losses occur at the motor.

18. Circuit arrangement according to claim 17, wherein the current regulator comprises a first comparator for an upper regulation threshold, a second comparator for a lower regulation threshold and inputs for values of the lower and the upper regulation threshold for regulating the motor current.

* * * * *